(12) United States Patent
Jurgensen et al.

(10) Patent No.: US 7,201,942 B2
(45) Date of Patent: *Apr. 10, 2007

(54) COATING METHOD

(75) Inventors: Holger Jurgensen, Aachen (DE); Johannes Kappeler, Wurselen (DE); Gerd Strauch, Aachen (DE); Dietmar Schmitz, Aachen (DE)

(73) Assignee: Aixtron AG (DE)

( * ) Notice: Subject to any disclaimer, the term of this patent is extended or adjusted under 35 U.S.C. 154(b) by 323 days.

This patent is subject to a terminal disclaimer.

(21) Appl. No.: 10/215,858

(22) Filed: Aug. 9, 2002

(65) Prior Publication Data

US 2003/0054099 A1 Mar. 20, 2003

Related U.S. Application Data

(63) Continuation of application No. PCT/EP01/01698, filed on Feb. 15, 2001.

(30) Foreign Application Priority Data

Feb. 16, 2000 (DE) .................. 100 07 059

(51) Int. Cl.
*C23C 16/00* (2006.01)
(52) U.S. Cl. .................. 427/248.1; 427/282; 118/724; 118/726; 118/728
(58) Field of Classification Search ............ 427/255.6, 427/248.1, 282; 118/724, 726, 715, 719, 118/728
See application file for complete search history.

(56) References Cited

U.S. PATENT DOCUMENTS

| | | | |
|---|---|---|---|
| 5,381,605 A * | 1/1995 | Krafft ......................... 34/408 |
| 5,462,008 A * | 10/1995 | Razeghi ......................... 117/2 |
| 5,554,220 A | 9/1996 | Forrest et al. ................. 117/88 |
| 5,595,606 A * | 1/1997 | Fujikawa et al. ........... 118/725 |
| 5,871,586 A | 2/1999 | Crawley et al. ............. 118/715 |
| 5,882,416 A * | 3/1999 | Van Buskirk et al. ...... 118/726 |
| 5,935,334 A * | 8/1999 | Fong et al. .......... 118/723 ME |
| 5,976,261 A | 11/1999 | Moslehi et al. ............. 118/719 |
| 6,019,848 A * | 2/2000 | Frankel et al. .............. 118/715 |

(Continued)

FOREIGN PATENT DOCUMENTS

DE 198 13 523 A1 10/1999

(Continued)

OTHER PUBLICATIONS

Baldi, Advanced Materials, 1998, vol. 10, No. 18, pp. 1505-1514.*

(Continued)

*Primary Examiner*—Bret Chen
(74) *Attorney, Agent, or Firm*—St. Onge Steward Johnston & Reens LLC

(57) ABSTRACT

A method for the production of coated substrates, such as OLEDs is disclosed, whereby at least one layer is deposited on the at least one substrate, by means of a condensation method and a solid and/or fluid precursor and, in particular, at least one sublimate source is used for at least one part of the reaction gases. The invention is characterized in that, by means of a temperature control of the reaction gases between precursor source(s) and substrate, a condensation of the reaction gases before the substrate(s) is avoided.

27 Claims, 7 Drawing Sheets

U.S. PATENT DOCUMENTS

| | | | |
|---|---|---|---|
| 6,035,101 A * | 3/2000 | Sajoto et al. | 392/416 |
| 6,197,121 B1 * | 3/2001 | Gurary et al. | 118/725 |
| 6,258,170 B1 * | 7/2001 | Somekh et al. | 118/715 |
| 6,309,465 B1 * | 10/2001 | Jurgensen et al. | 118/715 |
| 6,337,102 B1 * | 1/2002 | Forrest et al. | 427/64 |
| 6,849,241 B2 * | 2/2005 | Dauelsberg et al. | 423/328.2 |

FOREIGN PATENT DOCUMENTS

| | | |
|---|---|---|
| DE | 198 13 523 C2 | 3/2000 |
| EP | 0 821 084 | 1/1998 |
| WO | WO 95/02711 | 1/1995 |
| WO | WO 99/02756 | 1/1999 |

OTHER PUBLICATIONS

Random House Webster's Unabridged Dictionary second Ed., Random House, 2001, pp. 197 and 425.*

* cited by examiner

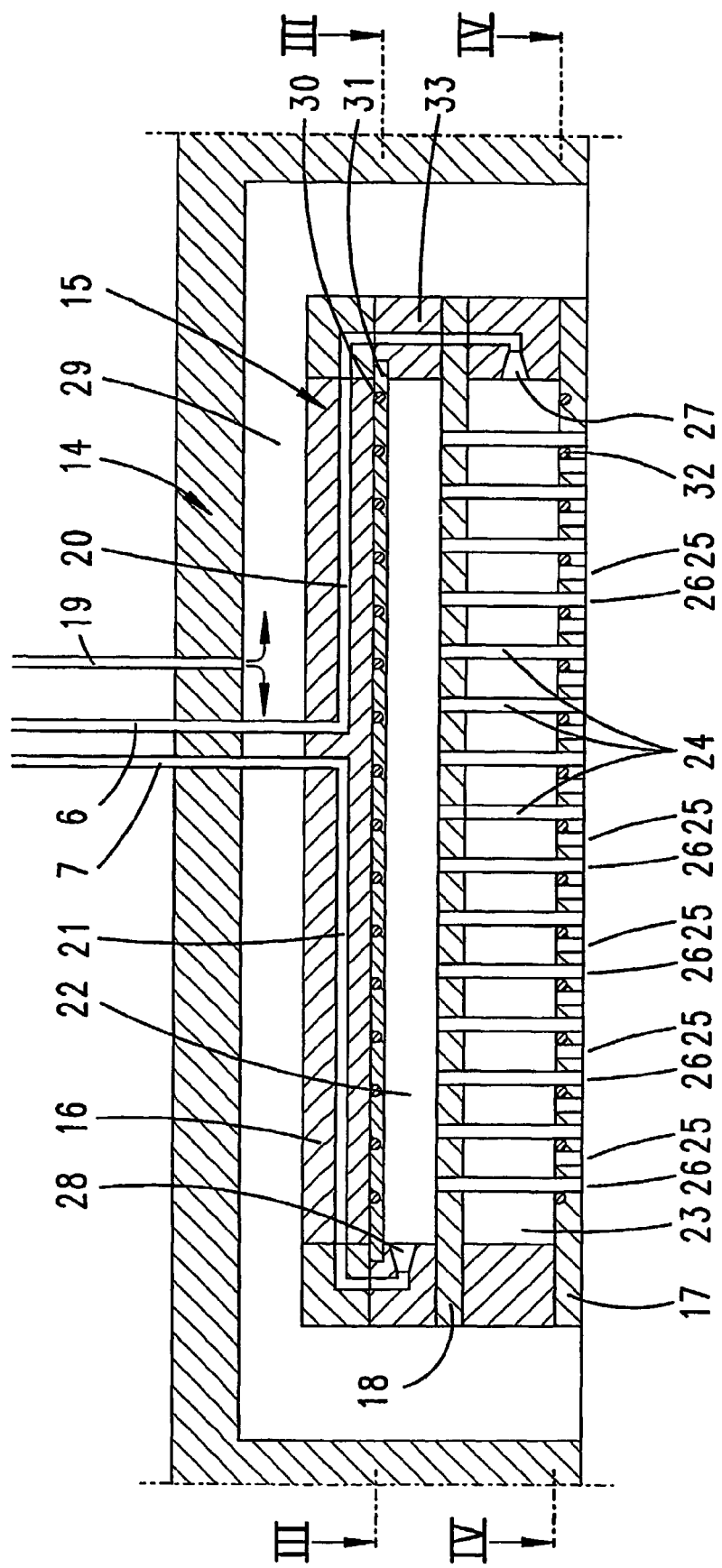

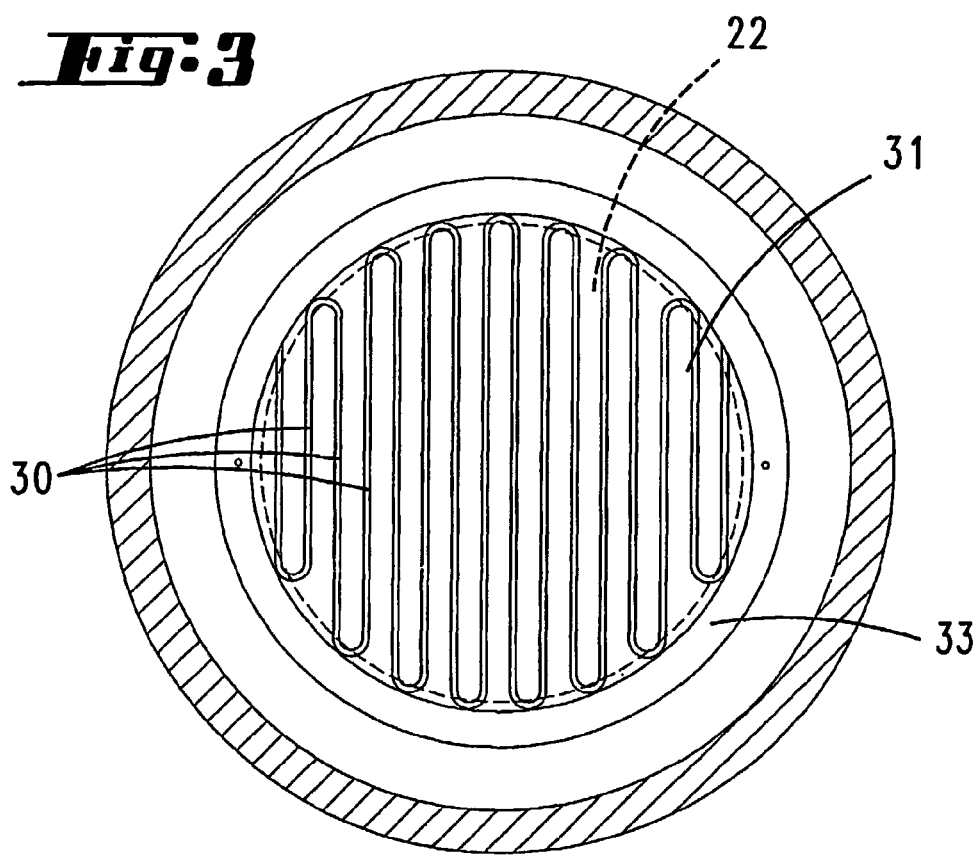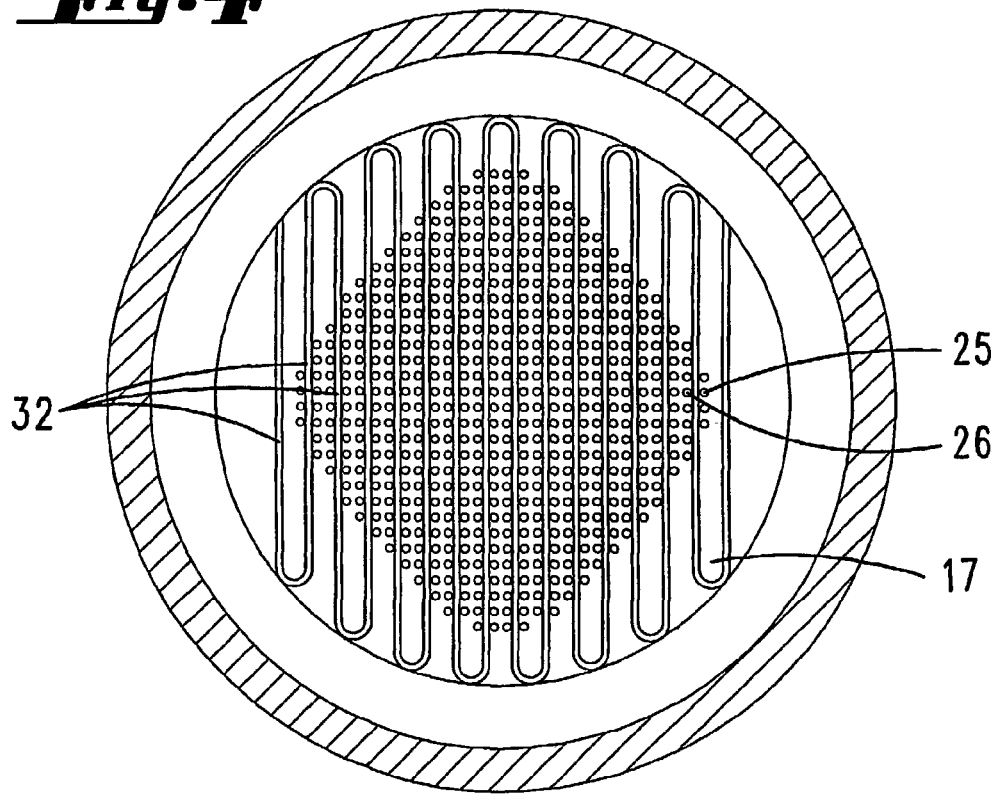

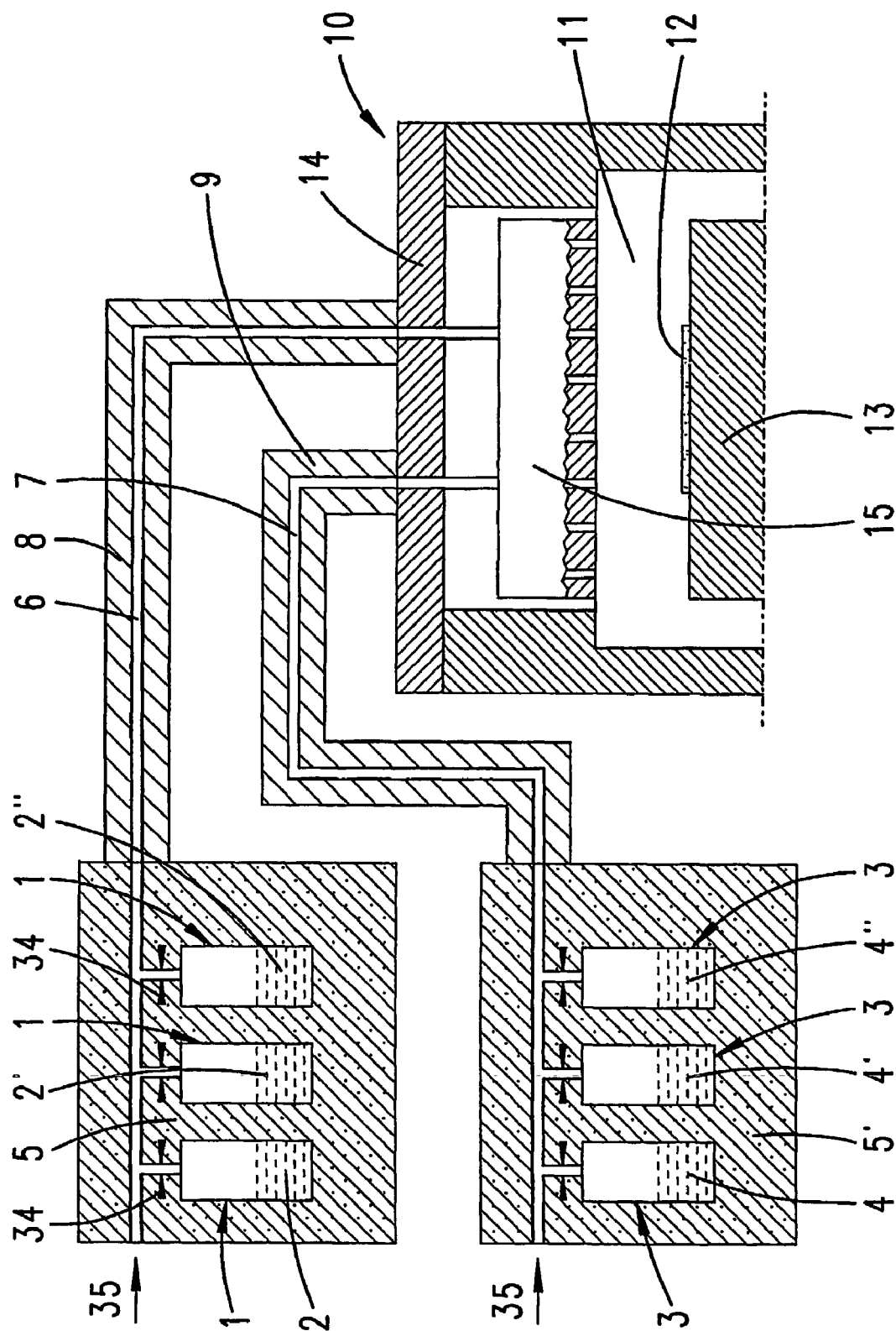

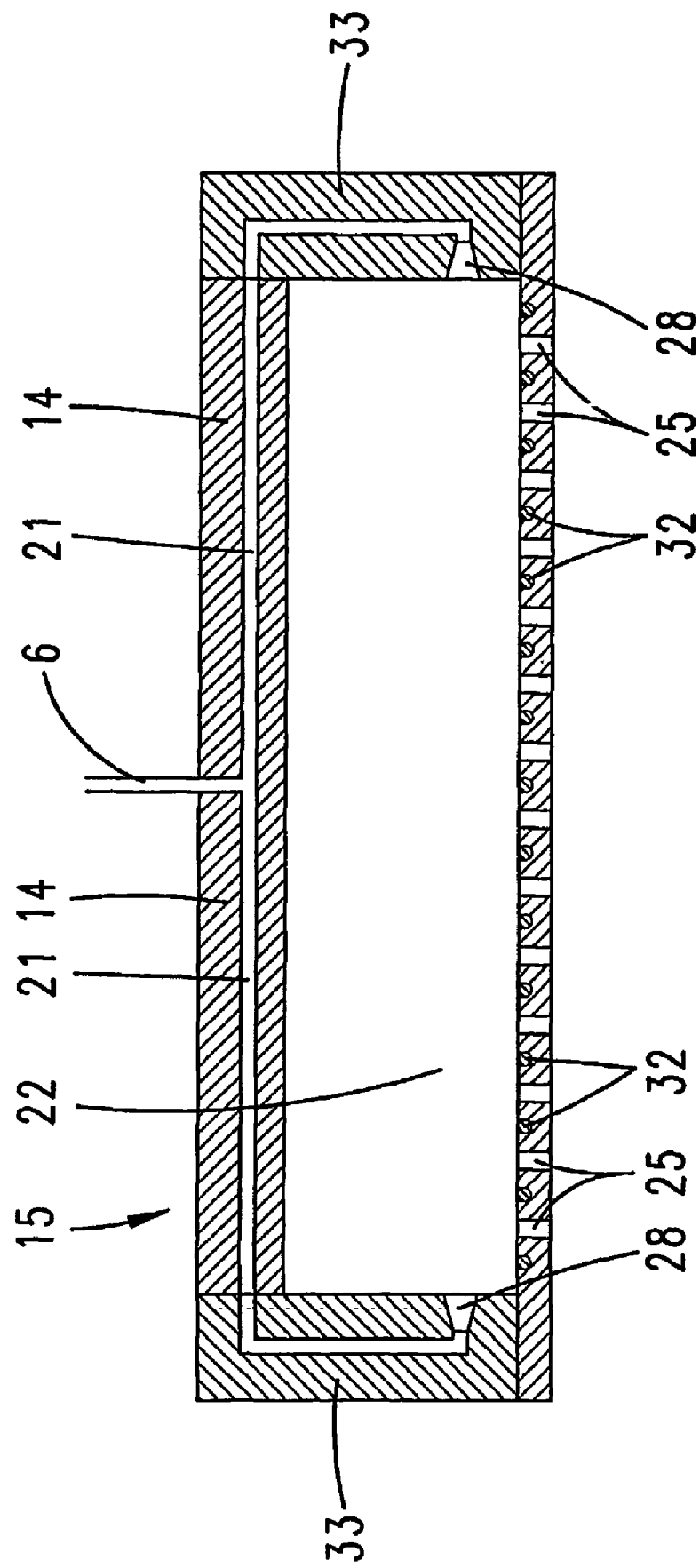

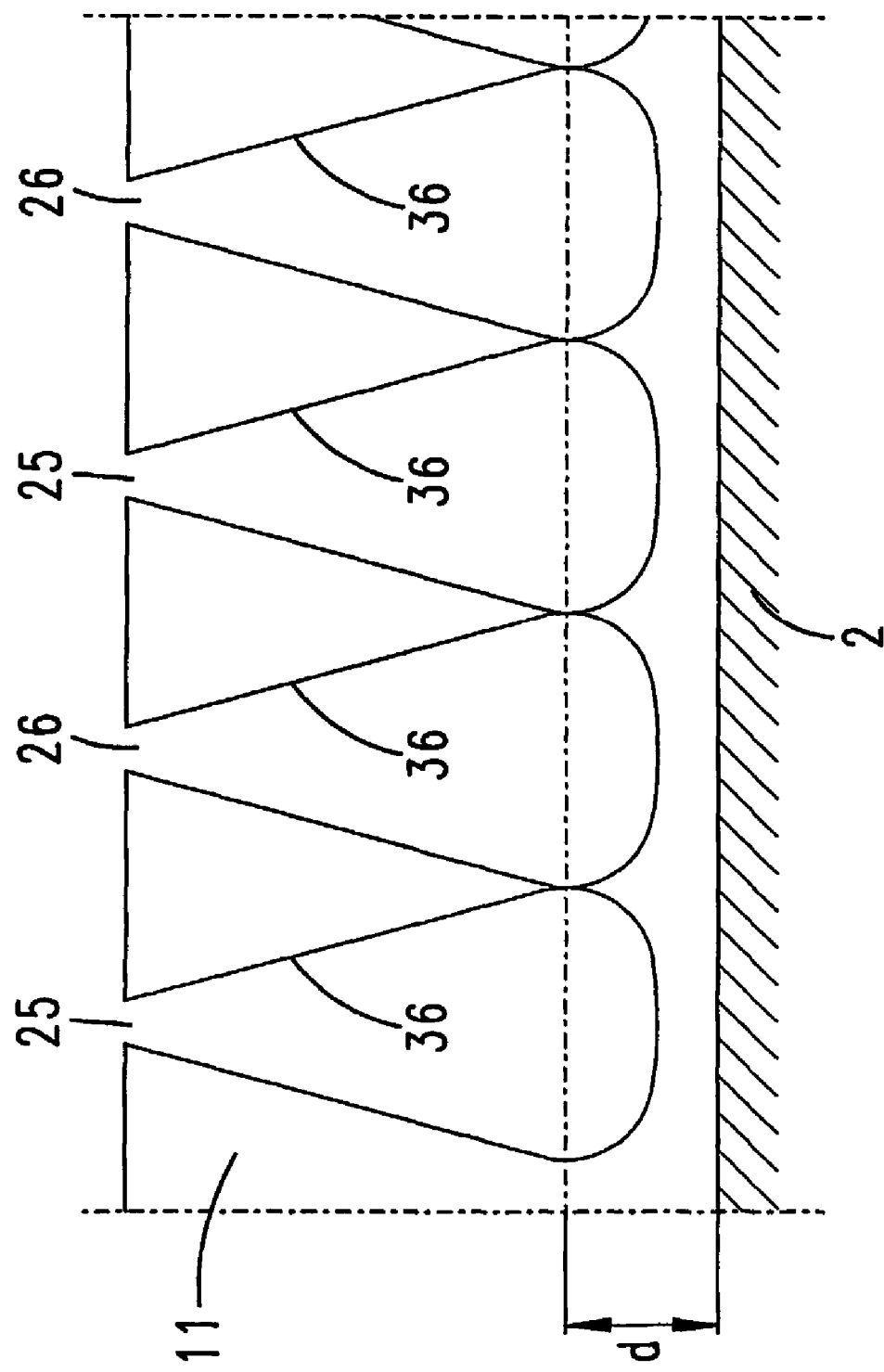

COATING METHOD

This application is a continuation of pending International Application No. PCT/EP01/01698 filed Feb. 15, 2001, which designates the United States and claims priority of German Application No. 100 07 059.0 filed Feb. 16, 2000.

FIELD OF THE INVENTION

The invention relates to a process and a device for the production of layer systems, such as for example for thin-film components, such as OLEDs or similar layer structures by means of condensation coating. These layer systems consist in particular of organic materials, such as for example small molecules (e.g. $Alq_3$) or polymers (e.g. PPV).

Condensation coating processes for the production of components in particular from organic materials are known. In this process, the constituents of the layer which is to be produced are conveyed by means of gaseous and/or organic compounds (salts) into the coating chambers (referred to below as reaction chambers).

The coating of the substrate (generally glass, sheet or plastics) takes place on the basis of the condensation process, in which the substrates are held at a temperature which is lower than the temperature of the molecules which are in the gas phase.

VPD (Vapor Phase Deposition) processes are used to deposit various materials from the vapor phase. This process has also gained acceptance in the field of deposition of organic layers. The VPD process is adjusted by means of different reactor designs, e.g.:

Horizontal tubular reactors, in which the gas flow runs horizontally and parallel to the coating surface (borrowed from conventional VPE reactors). To avoid wall condensation, which reduces efficiency, the reactors are configured as hot-wall systems.

This process or this known device is used to coat substrate geometries which are generally flat and do not vary.

The drawbacks are a) the process technology and geometric coupling of the precursor sublimation and the introduction thereof, b) the use of reactor geometries with a large system surface in relation to the coating surface, i.e. in hydrodynamic terms a large quantity of precursors are lost to coating on the substrate, c) expensive hot-wall technology which results from b).

In vapor deposition installations, the process principle of which corresponds to condensation, the source materials are integrated in the system, i.e. the source flow cannot be adjusted in terms of time. It cannot suddenly be switched on or off. Adjustment in terms of time is in this case effected by controlling the evaporation energy (electron beam or resistance heating). Furthermore, the systems are not formed as hot-wall systems, so that a significant proportion of the materials condense on the system walls and components, thus reducing efficiency.

The drawbacks of this technique also reside in the difficulty of adjusting stoichiometry or sharp transitions for multilayer requirements.

In the CVD system, the sources can be adjusted individually and accurately in terms of time and quantity, but the transfer from a source does not use the sublimation principle, but rather the vaporization principle. In these CVD systems, the coating process is not condensation but rather kinetic or diffusion-limited growth (chemical reaction). These processes and devices are used to coat substrate geometries which are generally flat and do not vary.

Alternatively processes are spin on or OMBD.

The processes and devices described above fail to satisfy the requirements for production of the layer systems cited by way of example in terms of one or more properties with regard to accurate adjustment of the stoichiometry and multilayer requirements and also economic viability.

The invention is based on the object of improving the process of the generic type in such a way that the parameters can be predetermined on an individual basis and that the efficiency is increased, and of increasing the quality of the layers which are condensed on the substrate.

The object is achieved by the invention which is described in the claims. The subclaims present advantageous refinements of the invention.

The use of a combination of special precursor sublimation, vaporization, gas inlet geometry and reactor geometry for the coating process improves the adjustment and economic viability of the process for condensation coating working on the basis of solid precursors. The precursors are sublimed or vaporized individually and outside the reaction chamber. These starting materials can condense selectively on the substrate. Structuring can be carried out by means of a mask assigned to the substrate. The mask may be secured to the substrate.

A common factor of all reactor designs is that the nature of the precursor sublimation after the gases have been introduced into the reaction vessel plays a crucial role in determining the vapor phase chemistry of the elemental substances and the way in which they are transported, and therefore the properties of the layers deposited, i.e. the way in which the gases are introduced dominates process control.

These properties are for example (i.e. without foreign atoms/substances) particles and/or defect density, composition in the multisubstance system, optical and electrical properties of the layers and efficiency of the deposition. The gas inlet geometries which are used according to the prior art satisfy either only the hydrodynamic objective or the thermodynamic objective.

There is often undesired deposition in the region of the inlet geometry. This forms when surface temperatures which are either too high (i.e. kinetically limited deposition) or too cold (i.e. condensation or thermophoresis) are set in the inlet region, or mixing of the gases occurs within the zone of introduction or within the chamber as a result of flow and/or diffusion (nucleation=homogeneous vapor phase reaction). The parasitic coverage then leads to the properties (thermal and/or chemical) of the gas inlet changing over the course of the process, so that adjustment by means of continuous and uniform deposition is not ensured. The parasitic accumulations lead to individual components being entrained into the subsequent layers. Furthermore, this coverage reduces the efficiency of the elements, particularly if the inlet geometry has a surface area which is large compared to the useful area.

Furthermore, the gas inlet unit is typically designed in such a way that the effective separation of the gases, which requires the thermally different properties of the precursors, is not ensured. This results in undesirable reactions between a number of gases in the vapor phase (i.e. nucleation), which has an adverse effect on the property of the layer which is to be deposited, for example particles or contamination. The nucleation reduces the efficiency of the material and leads to contamination of the layer with these compounds.

To reduce the drawbacks listed above, process technology currently dictates that gas inlets typically be disposed at a considerable distance from the surfaces which are to be coated, i.e. either spatially or through selection of the process parameters (e.g. very low pressure or high Reynolds numbers). The reactors which are currently known are therefore distinguished by a low efficiency (considerably less than 25%), i.e. only a small proportion of the elements which have been introduced are deposited in the usable functional layer.

Therefore, the layer properties produced with such systems are not optimum, and the economic viability of such systems is also only low.

For sublimation of the solid precursors, it is customary to use evaporator sources which, as a result of the choice of vessel pressure and temperature, convert the source material from the solid phase directly into vapor form, i.e. cause it to sublime. If the vapor pressure of the source material is very low, high temperatures are required. According to the current state of the prior art, therefore, some precursors are introduced into the reactor in boats. In the hot-wall systems which are used, the temperature of the reactors is profiled over the structural length in such a way that the sublimation temperature required for each precursor is established in in each case one zone. Drawbacks of this structure include inaccurate setting of the optimum sublimation temperature, large volumes of the evaporator device, lack of separation of pressure setting for each precursor variously and as a function of the reactor process pressure, inflexible and individual temperature setting for each precursor. However, the most serious drawback is the fact that the source flow is not controlled over the course of time, since these evaporator sources have the effect of being open to the coating zone.

The technical teaching which is presented in the present document is intended to eliminate all the abovementioned drawbacks and, depending on the particular application required, provides suitable processes and devices.

The sublimation device for the starting materials (precursors) is geometrically separated from the reactor and is configured individually according to the particular precursor. This allows flexible and optimized adjustment and control of the quantity conveyed for each precursor. Each precursor can be controlled individually and accurately over the course of time and, in addition, independently of reactor parameters.

The inlet geometry ensures that there is a minimal chamber surface area in relation to the coating surface (close to 1:1) and therefore a maximized efficiency of the process. The configuration of the geometry of the inlet fundamentally avoids reactions between the precursors and parasitic coverage at the surface of the inlet thereof.

The configuration of the inlet geometry of the precursors in combination with the reactor geometry ensures a homogeneous distribution of all the materials with accurate adjustment over the course of time.

The coatings which are produced are distinguished by homogeneity of the composition, layer thickness and doping in the region of 1%. Furthermore, with the equipment and process it is possible for transitions in the material and dopant profiles to be set accurately and reproducibly. The formation of particles is avoided by the invention.

The location of sublimation of the starting materials (precursors) is separate from the reactor chamber. The positioning is such that the starting material is guided into the gas inlet with minimal transients. For this purpose, in a coating system the starting material container is positioned in the immediate vicinity of, for example on the reactor cover. A short tube section conducts the material directly into the gas inlet unit.

The tank for the starting materials is heated specially and independently of the reactor temperature. Either a resistance heater around the tank is used for this purpose, or thermostated liquid is pumped in a hollow jacket surrounding the tank.

The pressure in the tank can be regulated individually and independently of the reactor using a regulating valve on the output side. The regulating valve is heated and, over the course of the material path, ensures a positive temperature gradient, in order to avoid local condensation.

Transport of the sublimed starting material to the reactor is assisted by means of a gas flow. This gas is also used to set a precursor concentration in the feed line.

To adjust the carrying of the starting materials into the reactor over the course of time, the pressure valve and the mass flow regulator is regulated, i.e. the throttle valve closes completely and the mass flow is set to zero.

This system can be repeated in numerous ways on the reactor, so that each material is regulated independently.

Opposite the substrate in the reactor, the gas inlet is configured as a system comprising a large number of nozzles (referred to as showerhead below) from one surface, referred to below as a plenum. The nozzles are dimensioned in such a way that they ensure turbulence-free injection into the chamber in accordance with the precursor property, such as viscosity, mass and concentration.

The distance from nozzle to nozzle is optimized in relation to the distance to the gas inlet, i.e. the jets which emerge from the nozzles fade away from the substrate surface and overall form a homogeneous flow plane.

Individually or in combination, the nozzles may be configured in any desired angle in the gas inlet surface in order to adjust the transport distribution of the starting materials homogeneously for the shape of the substrate.

The plane in which the nozzles are introduced for injection of the starting materials may be flat for the coating of flat substrates and also sheets or may be curved for nonplanar, i.e. preshaped substrates.

The entire plenum is thermally adjusted actively by means of coolant in a hollow-wall structure or by means of an electrical heater (resistance heater, Peltier) in such a way that a positive temperature gradient is set with respect to the sublimation temperature.

The sublimed starting material is injected into the interior volume of the plenum via a very short temperature-controlled line.

To set the optimized hydrodynamic conditions at the nozzles, carrier gas is introduced via a further feed line in addition to the starting materials.

This gas is furthermore responsible for rapid purging of the plenum for time-adjusted switching on and off of the precursor into the chamber.

The system described is, for multiple material applications, configured consistently for each precursor. Separate injection for each precursor is ensured using the "closed coupled showerhead" technique. Individual heating of each plenum leads to each starting material being compared along a positive temperature gradient in order to avoid parasitic condensation. The nozzles are dimensioned and disposed in such a way with respect to one another that there is no local mixing of the precursors at the nozzles. The positioning of the plenums in planes is selected in such a way that the longer nozzles in thermal contact with the subsequent plenums acquire a positive temperature gradient to avoid condensation of this precursor.

Suitable starting materials are in particular the salts which are described in U.S. Pat. No. 5,554,220. These salts are sublimed in evaporators. The evaporators may in particular have a form as described in German patent application DE 100 48 759. In this document, the gas is fed to the evaporator below a frit, on which the salt is located in the form of a bed. The gas, which is saturated with the gaseous starting material, is discharged above the frit or the bed. The partial pressure of the starting material is kept below its saturation partial pressure by means of a correspondingly higher temperature of the downstream tubes or by dilution, so that condensation is avoided.

BRIEF DESCRIPTION OF DRAWINGS

Exemplary embodiments of the invention are explained below with reference to appended drawings, in which:

FIG. 2 shows a likewise purely diagrammatic illustration of a gas inlet unit which can be used in a device according to FIG. 1, FIG. 3 shows a section on line III—III through the gas inlet unit, FIG. 4 shows a section on line IV—IV through the gas inlet unit, FIG. 5 shows a second exemplary embodiment of a device in a purely diagrammatic illustration, FIG. 6 shows a second exemplary embodiment of the gas inlet unit, FIG. 7 shows an aid which assists explanation of the process parameters.

DETAILED DESCRIPTION OF DRAWINGS

Figure 1:
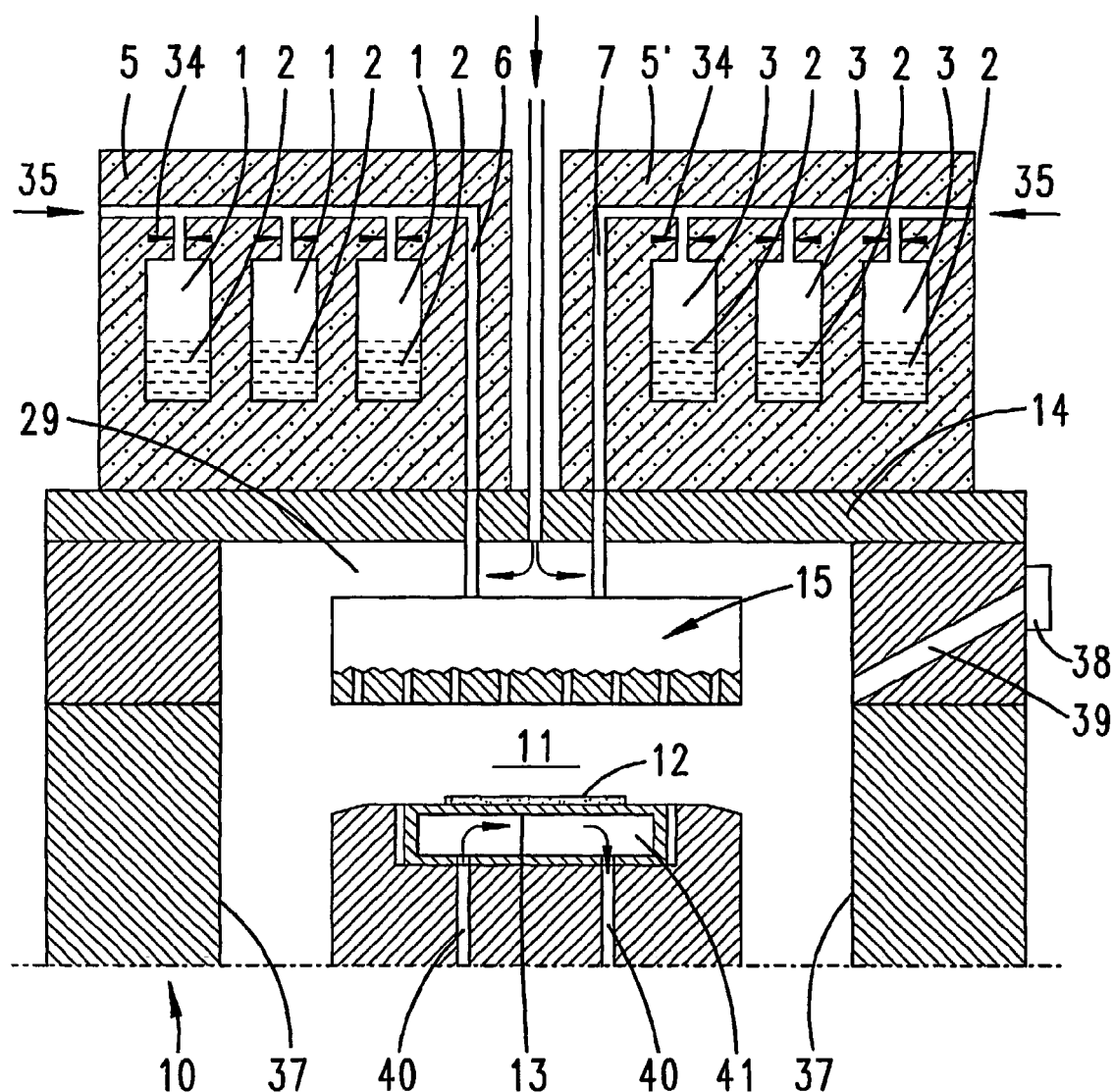
FIG. 1 shows a purely diagrammatic illustration of a device according to the invention.

The devices illustrated in FIGS. 1 and 5 each have two temperature-controlled containers 5, 5'. In the case of the device illustrated in FIG. 1, these containers are disposed directly on the cover 14 of the reactor 10. In the case of the exemplary embodiment illustrated in FIG. 5, the two containers 5, 5' are disposed at a certain distance from the reactor 10. In the containers 5, 5' there are tanks 1, 3. These tanks act as the source of the starting materials. Liquid starting materials 2, 4 are in the tanks 1, 3. The starting materials may also be solid. In the interior of the temperature-controlled containers 5, 5', the temperature is such that the starting materials 2, 4 located in the tanks 1, 3 are vaporized. The vaporization rate can be influenced by the temperature. In the exemplary embodiment, three sources are disposed in the container 5 and three sources are likewise disposed in the container 5'. The two containers 5, 5' may be held at different temperatures.

A carrier gas line leads into each of the two containers 5, 5' in order to supply a carrier gas 35. For each source, one discharge line for the gaseous starting materials which emerge from the tanks 1, 3 open out into the carrier gas line. The tanks 1, 3 can be closed and opened by means of heat-resistant valves, in particular regulating valves 34, which may also be heated themselves. The lines 6, 7 through which the carrier gas and the reaction gases which are transported by the carrier gas flow, in the exemplary embodiment of FIG. 1, open out directly into the reactor. In the exemplary embodiment shown in FIG. 5, the two lines 6, 7 run over a clear distance where they are held by means of temperature-controlled jackets 8, 9 at a temperature which is greater than or equal to the temperature in the containers 5, 5'. The lines 6, 7 open out into the reactor. The metering of the reaction gases is effected by means of the temperature of the containers 5, 5' and/or the regulating valves 34.

In the region where the lines 6, 7 open out, the reactor cover 14 is at a temperature which is greater than the temperature in the temperature-controlled containers 5, 5'. The lines 6, 7 do not open out directly into the reaction chamber 11, but rather initially open out into a gas inlet unit 15 which is located in the reaction chamber, spaced apart from the reactor cover 14 by a gap 29. A typical configuration of a gas inlet unit is shown in FIGS. 2 and 6.

The gas inlet unit 15 is located directly above the substrate 12. The reaction chamber is located between the substrate 12 and the baseplate 17 of the gas inlet unit 15. The substrate 12 lies on a susceptor 13, which is cooled. The temperature of the susceptor is regulated. For this purpose the susceptor may be provided with Peltier elements. However, it is also possible, as illustrated in FIG. 1, for the susceptor 13 on the inside to have a hollow chamber 41 which is purged with a cooling liquid by means of purge lines 40, so that as a result the temperature of the susceptor 13 can be held at a temperature which is lower than the temperature of the gas inlet unit 15.

This temperature is also lower than the temperature of the reactor walls 37. The temperature of the gas inlet unit 15 is above the condensation temperature of the starting materials 2, 4 which are introduced into the gas inlet unit 15 in gas form. Since the temperature of the reactor walls 37 is also higher than the condensation temperature, the molecules emerging from the gas inlet unit 15 only condense on the substrate 12 resting on the susceptor 13.

The gas inlet units 15 illustrated in FIGS. 2 and 6 are in each case a showerhead which is known per se. The exemplary embodiment of FIG. 2 illustrates a showerhead with a total of two volumes 22, 23 which are separate from one another. The volumes are delimited with respect to one another by means of an intermediate plate 18 and with respect to the reaction chamber 11 by means of a cover plate 16 and a baseplate 17. The showerhead according to FIG. 6, by contrast, has only one chamber. This volume 22 is delimited by the baseplate 17, a ring 33 and the cover plate 16. The abovementioned pipelines 6, 7 for the two starting materials open out into the cover plate 16. In the exemplary embodiment according to FIG. 6, only one pipeline 6 is required. The pipelines 6 and 7 open out into passages 21 and 20, respectively, which run in a star shape in the radial direction and are disposed in the cover plate 16. After a diversion in the edge region of the substantially cylindrical body of the gas inlet unit 15, the passages 20 and 21 open out into radially outer opening funnels 27 and 28, respectively, which are located at the outer periphery of the cylindrical volumes 22, 23. The gases which emerge from the opening funnels 27, 28 are distributed uniformly within the volumes 22, 23.

The intermediate plate 18 provided in a multichamber showerhead has openings from which small tubes 24 lead, which tubes project through the volume 23 and are connected to the baseplate 17 in such a manner that the gas located in the volume 22 does not come into contact with the gas located in the volume 23. In the baseplate 17 there are, alternating with the openings 26 of the small tubes 24, openings 25 from which the gas located in the volume 23 can emerge.

The gases located in the volumes 22, 23 pass through the openings 25, 26, which are of nozzle-like configuration, in a homogeneous flow field.

The gases emerge from the openings 25, 26 in turbulent manner. They in each case form a jet, so that the gas streams which emerge from adjacent openings 25, 26 are only mixed directly above the substrate 12, within the boundary layer denoted by d in FIG. 6. Above the boundary layer d, the jets 36 run substantially parallel to one another without any significant mixing taking place between them. A virtually homogeneous gas front is formed at the distance d.

In the exemplary embodiment illustrated in FIG. 2, the two volumes 22, 23 can be thermostated independently of one another. In the exemplary embodiment illustrated in FIG. 6, the single volume 22 can be thermostated. To regulate the volumes 22, 23 to a preset temperature which is greater than the temperature of the containers 5, 5' and considerably greater than the temperature of the susceptor 13, heating coils 30, 32 are provided. As an alternative to the heating coils 30, 32, however, it is also conceivable for passages to be introduced into the plates 17, 18, 16, and for a temperature-controlled liquid to be allowed to flow through these passages.

The ring 33 can be heated in a similar way. The ring may be assigned heating coils in a suitable way. However, it may also be held at temperature by suitably temperature-controlled liquids.

In the exemplary embodiment, a heating plate 31 is located beneath the cover plate 16. It can be seen from FIG. 3 that a heating coil 33 is introduced in the heating plate 31 in meandering form. The cover plate of the gas inlet unit 15 shown in FIG. 6 may also be heated.

A heating coil 33 is also introduced into the baseplate 17 in meandering form (cf. FIG. 4).

The salts which are described in U.S. Pat. No. 5,554,220 can be used as starting materials for the coating. These salts are sublimed in tanks as a result of a carrier gas which flows through a bed of the salts being fed to the tanks. An evaporator of this type is described in DE 100 48 759.9.

Figure 8:
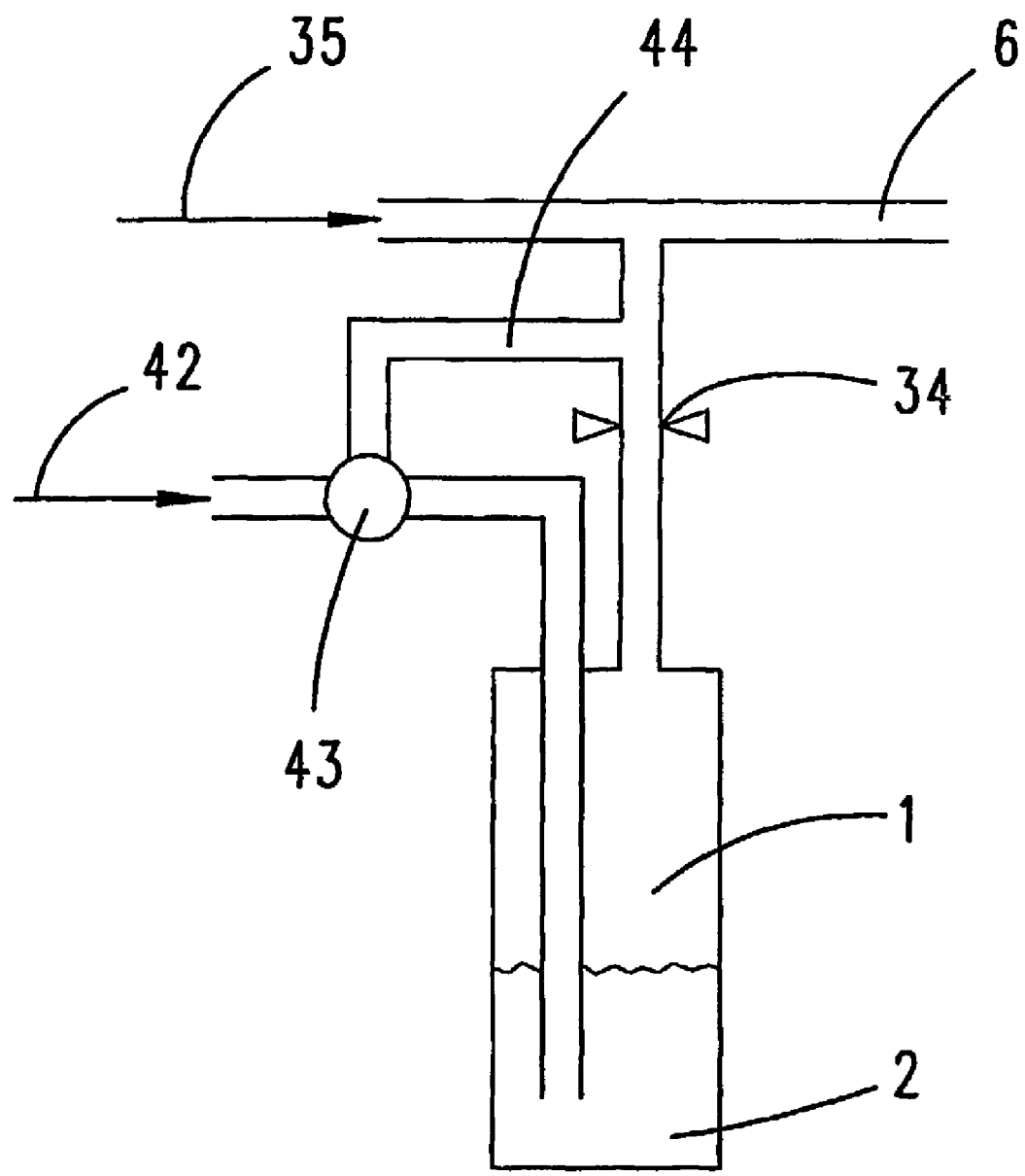
FIG. 8 shows a diagrammatic illustration of a source for a starting material.

Furthermore, by way of example FIG. 8 shows an evaporator for a liquid. A carrier gas 42 is introduced through a three-way valve via a feed line into the liquid or solid starting material 2. It then flows through the starting material 2 in order to leave the tank 1 through the outlet line and the heated valve 34. Via a pipeline 6, it is fed to the gas inlet unit 15 by means of the carrier gas 35. The purging of the tank with the carrier gas 42 can be switched on and off by means of the three-way valve. In the switched-off state, the carrier gas 42 flows through a bypass line 44 directly into the discharge line or the pipeline 6. The gas flow 42 and the gas flow 35 are subject to mass flow regulation. In order not to influence the mass flow 42 when the three-way valve 43 is being switched, the bypass line 44 may have the same flow resistance as the entire tank 1.

Each of the tanks 1, 3 indicated in FIGS. 1 and 5 may have a form and circuit as illustrated in FIG. 8 or as described in DE 100 48 759.9.

On account of the dilution which is effected by the carrier gas 35, the partial pressure of the starting material 2 or of the starting material 3 within the pipeline system which follows the tanks 1, 3 or within the gas inlet unit 15 falls. This dilution means that the temperature in these subsequent pipe sections 6, 7 and/or in the gas inlet unit 15 may be lower than the temperature in the containers 5, 5' without condensation occurring, since the temperature is still sufficiently high for the partial pressure of the individual starting materials to be below their saturation vapor pressure.

The substrate temperature can be measured by means of one or more sensors 38 which are disposed in particular outside the reactor wall and which are connected to the reaction chamber 11 via a passage 39.

The thermal conductivity of the gas which is introduced in the gap 29 can be varied by selection of a suitable composition. Accordingly, the heat transfer from or to the gas inlet unit 15 can be set by the choice of the gas composition. The temperature can also be influenced in this way.

All features disclosed are (inherently) pertinent to the invention. The disclosure content of the associated/appended priority document (copy of the prior application) is hereby incorporated in its entirety in the disclosure of the application, partly for the purpose of incorporating features of these documents in claims of the present application.

What is claimed is:

1. A process for coating substrates, comprising:
providing a reactor having reactor walls at least partly defining a reaction chamber;
providing first and second source containers outside the reaction chamber containing first and second precursors, respectively;
providing a susceptor having a surface for holding a substrate inside the reaction chamber;
providing a gas inlet unit inside the reaction chamber, the gas inlet unit including a first plenum and a second plenum having a baseplate, the baseplate being located opposite the susceptor surface and having an area substantially equal to the area of the susceptor surface such that the baseplate and the susceptor surface define a reaction space therebetween;
heating the first and second source containers separately from each other to first and second sublimation temperatures, respectively;
communicating the first and second precursors to the first and second plenums, respectively;
heating the first plenum to produce a positive temperature gradient with respect to the first sublimation temperature, and heating the second plenum separately from the first plenum to produce a positive temperature gradient with respect to the second sublimation temperature;
heating the reactor walls to a temperature greater than the temperature of the susceptor;
maintaining the temperature of the susceptor lower than the temperature of the second plenum to produce a negative temperature gradient with respect to the temperature of the second plenum; and
communicating the first precursors from the first plenum into the reaction space, and separately communicating the second precursors from the second plenum into the reaction space.

2. The process of claim 1, wherein the step of communicating the first and second precursors to the first and second plenums comprises communicating the first and second precursors through first and second lines, respectively, and heating the first and second lines to maintain the temperatures of the first and second precursors at least equal to the first and second sublimation temperatures, respectively.

3. The process of claim 1, wherein the gas inlet unit comprises nozzles passing through the second plenum for communicating the first precursors from the first plenum to the reaction area without mixing with the second precursors in the second plenum.

4. The process of claim 3, wherein the second plenum is heated to produce a positive temperature gradient with respect to the temperature of the first plenum.

5. The process of claim 1, further comprising selecting a velocity at which the precursor are communicated into the reaction space that avoids local Bernoulli effects.

6. The process of claim 1, further comprising regulating the pressures in each source container by controlling a valve and purging inert gas.

7. The process of claim 1, wherein the source containers, reactor walls, and plenums are heated with electrically active components.

8. The process of claim 1, wherein the susceptor is cooled using a liquid.

9. The process of claim 1, wherein the precursors are communicated to the plenums via a carrier gas.

10. The process of claim 9, wherein the carrier gas comprises Ar, $H_2$, $N_2$, or He.

11. The process of claim 1, further comprising providing sensors and corresponding passages in the reactor walls for measuring properties of the substrate or layers thereon.

12. The process of claim 1, wherein the susceptor is adapted to hold substrates that are round, polygonal, flat, or curved.

13. The process of claim 1, further comprising the step of masking the substrate.

14. A process for coating substrates, comprising:
providing a reactor having reactor walls at least partly defining a reaction chamber;
providing first and second source containers outside the reaction chamber containing first and second precursors, respectively;
providing a susceptor having a surface for holding a substrate inside the reaction chamber;
providing a gas inlet unit inside the reaction chamber, the gas inlet unit having a first plenum and a second plenum adjacent the susceptor;
heating the first and second source containers separately from each other to first and second sublimation temperatures, respectively;
communicating the first and second precursors to the first and second plenums, respectively;
heating the first plenum to produce a positive temperature gradient with respect to the first sublimation temperature, and heating the second plenum separately from the first plenum to produce a positive temperature gradient with respect to the second sublimation temperature;
heating the reactor walls to a temperature greater than the temperature of the susceptor;
maintaining the temperature of the susceptor lower than the temperature of the second plenum to produce a negative temperature gradient with respect to the temperature of the second plenum; and
communicating the first precursors from the first plenum into the reaction chamber, and separately communicating the second precursors from the second plenum into the reaction chamber.

15. The process of claim 14, wherein the step of communicating the first and second precursors to the first and second plenums comprises communicating the first and second precursors through first and second lines, respectively, and heating the first and second lines to maintain the temperatures of the first and second precursors at least equal to the first and second sublimation temperatures, respectively.

16. The process of claim 14, wherein the gas inlet unit comprises nozzles passing through the second plenum for communicating the first precursors from the first plenum to the reaction area without mixing with the second precursors in the second plenum.

17. The process of claim 16, wherein the second plenum is heated to produce a positive temperature gradient with respect to the temperature of the first plenum.

18. The process of claim 14, further comprising selecting a velocity at which the precursor are communicated into the reaction space that avoids local Bernoulli effects.

19. The process of claim 14, further comprising regulating the pressures in each source container by controlling a valve and purging inert gas.

20. The process of claim 14, wherein the source containers, reactor walls, and plenums are heated with electrically active components.

21. The process of claim 14, wherein the susceptor is cooled using a liquid.

22. The process of claim 14, wherein the precursors are communicated to the plenums via a carrier gas.

23. The process of claim 22, wherein the carrier gas comprises Ar, $H_2$, $N_2$, or He.

24. The process of claim 14, further comprising providing sensors and corresponding passages in the reactor walls for measuring properties of the substrate or layers thereon.

25. The process of claim 14, wherein the susceptor is adapted to hold substrates that are round, polygonal, flat, or curved.

26. The process of claim 14, further comprising the step of masking the substrate.

27. A process for coating substrates, comprising:
providing a reactor having reactor walls at least partly defining a reaction chamber;
providing a plurality of source containers located outside the reaction chamber for supplying precursors;
providing a susceptor having a surface for holding a substrate inside the reaction chamber;
providing a gas inlet unit inside the reaction chamber and in communication with the source containers, the gas inlet unit having a baseplate located opposite the susceptor surface, the baseplate having an area substantially equal to the area of the susceptor surface such that the baseplate and the susceptor surface define a reaction space therebetween;
heating the source containers;
communicating the precursors from the source containers to the gas inlet unit;
heating the reactor walls to a temperature greater than the temperature of the susceptor;
maintaining the temperature of the susceptor lower than the temperatures of the gas inlet unit and the reactor walls; and
communicating the precursors from the gas inlet unit into the reaction space.

* * * * *